(12) United States Patent
Cypher (10) Patent No.: US 8,615,698 B1
(45) Date of Patent: Dec. 24, 2013

(54) SKEWED ORTHOGONAL CODING TECHNIQUES

(75) Inventor: Robert Cypher, Saratoga, CA (US)

(73) Assignee: Google Inc., Mountain View, CA (US)

( * ) Notice: Subject to any disclaimer, the term of this patent is extended or adjusted under 35 U.S.C. 154(b) by 148 days.

(21) Appl. No.: 13/246,966

(22) Filed: Sep. 28, 2011

(51) Int. Cl.
*H03M 13/00* (2006.01)

(52) U.S. Cl.
USPC .......................................... 714/758

(58) Field of Classification Search
None
See application file for complete search history.

(56) References Cited

U.S. PATENT DOCUMENTS

| | | | |
|---|---|---|---|
| 5,276,674 A * | 1/1994 | Tanaka ........................ 369/53.15 |
| 5,469,448 A * | 11/1995 | Denissen et al. .............. 714/755 |
| 5,778,011 A * | 7/1998 | Blaum et al. .................. 714/755 |
| 5,856,890 A * | 1/1999 | Hamai et al. ..................... 360/53 |
| 6,014,493 A * | 1/2000 | Shimoda ........................ 386/314 |
| 6,032,269 A | 2/2000 | Renner, Jr. |
| 6,151,641 A | 11/2000 | Herbert |
| 6,216,247 B1 | 4/2001 | Creta et al. |
| 6,311,304 B1 * | 10/2001 | Kwon ........................... 714/755 |
| 6,378,038 B1 | 4/2002 | Richardson et al. |
| 6,721,317 B2 | 4/2004 | Chong, Jr. |
| 6,802,450 B2 * | 10/2004 | Cheung et al. .......... 235/462.25 |
| 7,055,082 B2 * | 5/2006 | Mori et al. ..................... 714/768 |
| 7,103,824 B2 * | 9/2006 | Halford ......................... 714/759 |
| 7,174,496 B2 * | 2/2007 | Han et al. ...................... 714/770 |
| 7,327,659 B2 * | 2/2008 | Lee et al. ..................... 369/59.24 |
| 7,340,663 B2 * | 3/2008 | Van Dijk et al. .............. 714/755 |
| 7,356,752 B2 * | 4/2008 | Hewitt et al. ................. 714/755 |
| 7,376,888 B2 * | 5/2008 | Jaquette et al. ............... 714/771 |
| 7,398,459 B2 | 7/2008 | Park et al. |
| 7,505,890 B2 | 3/2009 | Kuznetsov et al. |
| 7,546,484 B2 | 6/2009 | Sen et al. |
| 7,624,229 B1 | 11/2009 | Longinov |
| 7,667,628 B2 * | 2/2010 | Breiling ......................... 341/81 |
| 7,676,730 B2 | 3/2010 | Haugan et al. |
| 7,739,446 B2 | 6/2010 | Kano |
| 7,774,681 B2 | 8/2010 | Earhart et al. |
| 7,831,764 B2 | 11/2010 | Nakajima et al. |
| 7,831,869 B2 * | 11/2010 | Hana et al. .................... 714/702 |
| 7,861,035 B2 | 12/2010 | Baek et al. |
| 7,861,052 B2 | 12/2010 | Kawamura et al. |
| 8,065,555 B2 | 11/2011 | Maiyuran et al. |
| 8,069,388 B2 * | 11/2011 | Betts ............................ 714/755 |
| 8,082,393 B2 | 12/2011 | Galloway et al. |
| 8,090,792 B2 | 1/2012 | Dubnicki et al. |

(Continued)

OTHER PUBLICATIONS

Jaquette G. A.; LTO: A better format for mid-range tape; IBM Journal of Research and Development; vol. 47, No. 4, pp. 429-444 (2003).*

(Continued)

*Primary Examiner* — Albert Decady
*Assistant Examiner* — Enamul M Kabir
(74) *Attorney, Agent, or Firm* — Fish & Richardson P.C.

(57) ABSTRACT

Methods, systems, and apparatus, including computer programs encoded on a computer storage medium, for skewed orthogonal coding techniques. In one aspect, a method includes receiving data chunks to be stored and generating intra-level code chunks and inter-level code chunks using the data chunks and partitions of numbers. Levels of codewords are stored. The partitions are selected so that, for at least a first set of chunks A, B, and A' wherein A and B are in a same intra-level codeword and A and A' are in a same inter-level codeword, there is no chunk B' that is in both an intra-level codeword containing A' and an inter-level codeword containing B.

36 Claims, 8 Drawing Sheets

(56) References Cited

U.S. PATENT DOCUMENTS

| | | | |
|---|---|---|---|
| 8,136,020 B2 * | 3/2012 | Haas et al. ............... 714/782 |
| 8,140,753 B2 | 3/2012 | Galloway et al. |
| 8,144,414 B2 * | 3/2012 | Cherubini et al. ............ 360/48 |
| 8,145,865 B1 | 3/2012 | Longinov et al. |
| 8,176,247 B2 | 5/2012 | Galloway et al. |
| 8,179,781 B2 * | 5/2012 | Sun et al. ............... 370/208 |
| 8,180,954 B2 | 5/2012 | Kilzer et al. |
| 8,213,205 B2 | 7/2012 | Rajan |
| 8,233,539 B2 * | 7/2012 | Kwon ............... 375/240.13 |
| 8,234,539 B2 | 7/2012 | Erez |
| 8,255,761 B1 | 8/2012 | Pi et al. |
| 8,276,038 B2 * | 9/2012 | Cideciyan et al. ........... 714/755 |
| 8,279,755 B2 | 10/2012 | Luby |
| 8,312,341 B1 * | 11/2012 | Varnica et al. ............ 714/752 |
| 8,327,234 B2 | 12/2012 | Earnshaw et al. |
| 8,374,218 B2 * | 2/2013 | Gunter ............... 375/145 |
| 8,386,894 B2 * | 2/2013 | Latremouille ............ 714/785 |
| 2003/0149750 A1 | 8/2003 | Franzenburg |
| 2006/0080505 A1 | 4/2006 | Arai et al. |
| 2009/0262839 A1 | 10/2009 | Shelby et al. |
| 2009/0265578 A1 | 10/2009 | Baloun et al. |
| 2010/0037117 A1 | 2/2010 | Pescatore |
| 2010/0217915 A1 | 8/2010 | O'Connor et al. |
| 2012/0036333 A1 | 2/2012 | Lecrone et al. |
| 2012/0042142 A1 | 2/2012 | Garman et al. |
| 2012/0042200 A1 | 2/2012 | Takeuchi et al. |
| 2012/0042201 A1 | 2/2012 | Resnick |
| 2012/0131383 A1 | 5/2012 | Galloway et al. |
| 2012/0246548 A1 | 9/2012 | Buckley et al. |

OTHER PUBLICATIONS

Reed Solomon; Wikipedia; http://en.wikipedia.org/wiki/Reed_Solomon; Jan. 1, 2100; 14 pages.

Duminuco, Alessandro; Hierarchical Codes: How to Make Erasure Codes Attractive for Peer-to-Peer Storage Systems; 2008 (P2P'08); pp. 8-11; 10 pages; Proceedings of the Eighth International Conference on Peer-to-Peer Computing.

Hafner, James; HoVer Erasure Codes for Disk Arrays; Proceedings of the 2006 International Conference on Dependable Systems and Networks; 2006; pp. 217-226, 10 pages.

Li, Mingqiang; Grid Codes: Strip-Based Erasure Codes with High Fault Tolerance for Storage Systems; ACM Transactions on Storage; Jan. 2009; vol. 4, No. 4, Article 15, 22 pages.

* cited by examiner

FIG. 1

Partition P0

Partition P1

Partition P2

Partition P3

Partition P4

Partition P5

FIG. 2

Level 0

Level 1

Level 2

Level 3

Level 4

Level 5

|        |    |    |    |    |    |     |     |
|--------|----|----|----|----|----|-----|-----|
| Level 0 | 11 | 0  | 2  | 9  | 13 |     |     |
|        | 8  | 12 | 24 | 19 | 7  |     |     |
|        | 16 | 5  | 21 | 1  | 22 |     |     |
|        | 20 | 6  | 3  | 23 | 15 |     |     |
|        | 4  | 18 | 10 | 14 | 17 |     |     |

|        |    |    |    |    |    |
|--------|----|----|----|----|----|
| Level 1 | 20 | 7  | 2  | 13 | 5  |
|        | 9  | 21 | 15 | 4  | 23 |
|        | 10 | 1  | 19 | 11 | 0  |
|        | 17 | 22 | 6  | 24 | 18 |
|        | 3  | 16 | 12 | 14 | 8  |

|        |    |    |    |    |    |
|--------|----|----|----|----|----|
| Level 2 | 22 | 8  | 15 | 12 | 4  |
|        | 5  | 1  | 16 | 2  | 18 |
|        | 14 | 20 | 6  | 23 | 11 |
|        | 10 | 24 | 9  | 0  | 21 |
|        | 19 | 3  | 7  | 17 | 13 |

|        |    |    |    |    |    |
|--------|----|----|----|----|----|
| Level 3 | 17 | 10 | 20 | 5  | 12 |
|        | 22 | 14 | 8  | 1  | 23 |
|        | 2  | 7  | 3  | 24 | 15 |
|        | 19 | 0  | 16 | 21 | 18 |
|        | 11 | 13 | 4  | 9  | 6  |

|        |    |    |    |    |    |     |     |
|--------|----|----|----|----|----|-----|-----|
| Level 4 | 11 | 19 | 1  | 16 | 9  | LR0 | LR1 |
|        | 6  | 23 | 22 | 13 | 14 | LR0 | LR1 |
|        | 18 | 15 | 4  | 20 | 5  | LR0 | LR1 |
|        | 0  | 21 | 24 | 8  | 17 | LR0 | LR1 |
|        | 10 | 2  | 12 | 7  | 3  | LR0 | LR1 |

SKEWED ORTHOGONAL CODING TECHNIQUES

BACKGROUND

This specification relates to digital data processing.

Important data is conventionally stored on storage devices that potentially fail. The data can be backed-up and stored redundantly so that the data can be recovered if a storage device fails. Conventional data centers can store large amounts of data. Some data is stored redundantly across multiple data centers so that even if an entire data center fails the data can be recovered.

Data can be stored using error-detecting codes. An error-detecting code adds extra information to the data that enables detection of certain errors in the data. One example of an error-detecting code is a cyclic redundancy check (CRC). CRC codes are used to detect failures on storage devices (e.g., hard disk drives).

Data can also be stored using error-correcting codes. An error-correcting code adds extra data to the data that enables correction of errors in the data. The number of errors that can be corrected is typically limited by the amount of extra data that is added. Examples of error-correcting codes include Reed-Solomon codes.

SUMMARY

A system of one or more computers stores data using a skewed orthogonal code. The system generates codewords of data chunks and error-correcting code chunks. The system skews the codewords using, for example, orthogonal or random partitions. The system uses the partitions to generate intra-level codewords and inter-level codewords. As a result of skewing the codewords, the inter-level codewords are more independent of the intra-level codewords than they would be without skewing the codewords, thus increasing the likelihood that a given set of damaged chunks can be reconstructed.

In general, one innovative aspect of the subject matter described in this specification can be embodied in methods that include the actions of receiving a plurality of data chunks to be stored using k partitions of x numbers, wherein k and x are each greater than one, and wherein each partition defines a plurality of groups of the x numbers; generating a plurality of intra-level code chunks using the data chunks and a first error correcting code, resulting in a plurality of intra level codewords organized according to the groups of the partitions; generating a plurality of inter-level code chunks using the data chunks and a second error correcting code, resulting in x inter level codewords organized according to the numbers of the partitions; and storing each level of k levels of codewords, the k levels of codewords including the plurality of intra-level codewords and the plurality of inter-level codewords; wherein the partitions are selected so that, for at least a first set of chunks A, B, and A' wherein A and B are in a same intra-level codeword and A and A' are in a same inter-level codeword, there is no chunk B' that is in both an intra-level codeword containing A' and an inter-level codeword containing B. Other embodiments of this aspect include corresponding systems, apparatus, and computer programs, configured to perform the actions of the methods, encoded on computer storage devices. A system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

These and other embodiments can each optionally include one or more of the following features. Storing each level of k levels of codewords includes storing each level at a distinct group of storage nodes. Generating the intra-level code chunks includes associating each data chunk with a group of the partitions, and wherein each intra-level codeword includes data chunks associated with a same group. Generating the inter-level code chunks includes associating each data chunk with a number of the partitions, and wherein each inter-level codeword includes data chunks associated with a same number. The k partitions of x numbers are orthogonal so that, for any two numbers x1 and x2, x1 and x2 are in a same group in a first partition and not in a same group in any other partition. The k partitions of x numbers define the groups of numbers based on random or pseudo-random numbers. m of the levels include the inter-level code chunks, wherein m is greater than or equal to one; and (k–m) of the levels include the intra-level codewords, each intra level codeword including d data chunks and n code chunks. Storing each level of the k levels of codewords includes distributing the inter-level code chunks evenly across the k groups of storage nodes. Distributing the inter-level code chunks evenly across the k groups of storage nodes includes allocating the inter-level code chunks to groups of storage nodes according to the numbers of one of the partitions. Two orthogonal partitions are assigned to each level and each data chunk is included in two intra-level codewords organized according to the two partitions assigned to that level. The actions further comprise generating and storing local-remote code chunks for local-remote codewords that include the inter-level code chunks. The first and second error correcting codes are linear Maximal Distance Separable (MDS) codes in systematic form.

Particular embodiments of the subject matter described in this specification can be implemented so as to realize one or more of the following advantages. Data can be stored, accessed, and maintained at one or more storage nodes. Compared to conventional techniques, the amount of storage capacity required can be reduced, the amount of data that must be read to reconstructed a damaged chunk can be reduced, and the expected time to data loss can be increased for both random failures and for burst failures. The amount of communication between data centers required for reconstruction of a damaged chunk can be reduced or minimized.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
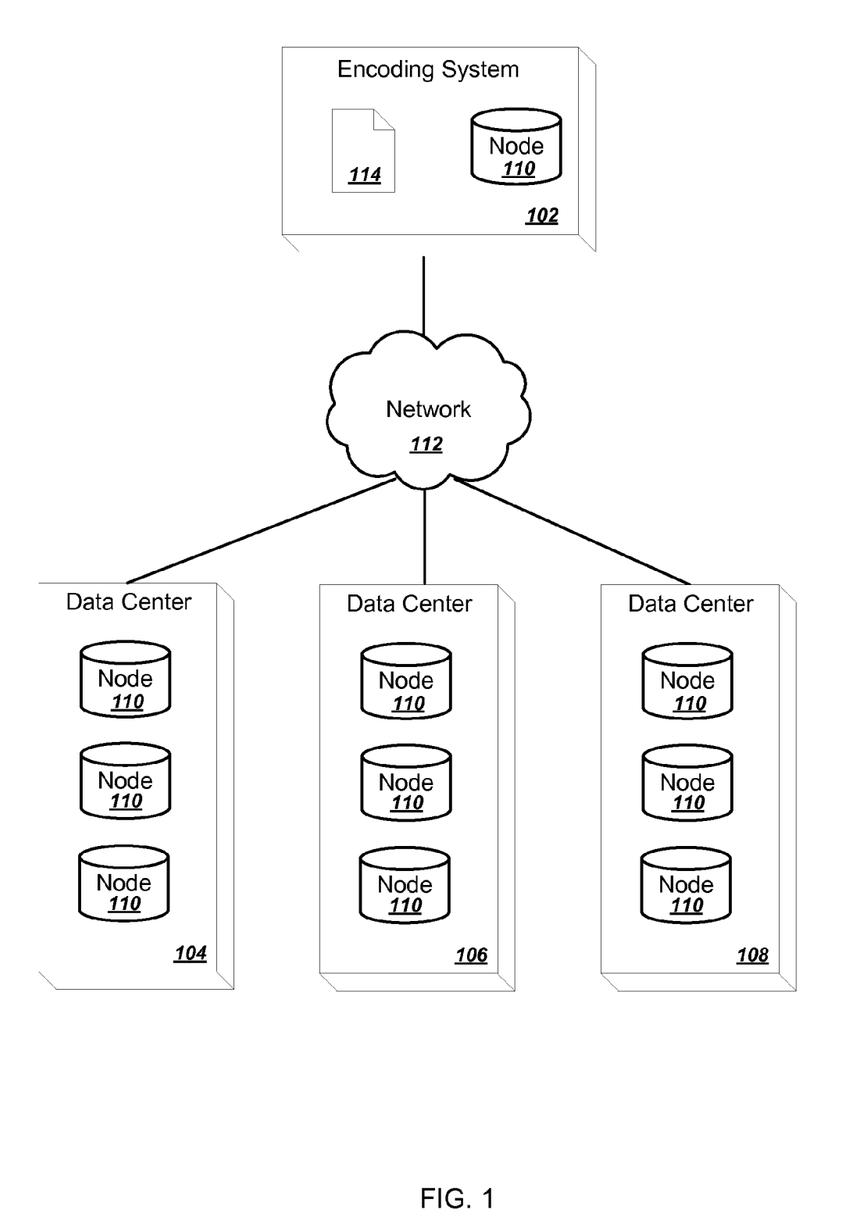
FIG. 1 is a schematic diagram of an example encoding system.

FIG. 1 is a schematic diagram of an example encoding system 102. In particular, the encoding system 102 is configured to store data using skewed orthogonal coding techniques to generate error-correcting code chunks.

The encoding system 102 includes one or more data processing apparatus. The encoding system 102 can store data chunks from a file 114, located, for example, at one or more local storage nodes 110, or across one or more storage nodes 110 located at data centers 104, 106, and 108. The encoding system 102 can also store redundant copies of data chunks and error-correcting code chunks. The encoding system communicates with the data centers 104, 106, and 108 using a network 112.

A storage node includes one or more computer storage mediums. In some implementations, a storage node is a data server, for example, a server including a data processing apparatus and multiple hard disk drives on which data can be stored. A group of storage nodes can include a rack, a sub-network, a data center, or various other collections of servers or storage nodes.

A data center is a group of storage nodes. Typically, a data center is a facility with physical space for computer systems. Data centers can include, for example, telecommunication systems, backup power supplies, climate controls, and security. In FIG. 1, the data centers 104, 106, and 108 are shown with three storage nodes; however, each data center can have more or fewer storage nodes.

A data chunk is a specified amount of data. In some implementations, a data chunk is a contiguous portion of data from a file. In other implementations, a data chunk is one or more non-continuous portions of data from a file. For example, a data chunk can be 256 bytes or other units of data.

A damaged chunk is a chunk containing one or more errors. Typically, a damaged chunk is identified using an error detecting code. For example, a damaged chunk can be completely erased (e.g., if the chunk was stored in a hard drive destroyed in a hurricane), or a damaged chunk can have a single bit flipped. A healthy chunk is a chunk that is not damaged.

An error-correcting code chunk includes a chunk of data based on one or more data chunks. In some implementations, each code chunk is the same specified size (e.g., 256 bytes) as the data chunks. The code chunks are generated using an error-correcting code, e.g., a Maximal Distance Separable (MDS) code. Examples of MDS codes include Reed-Solomon codes. Various techniques can be used to generate the code chunks. In general, any error-correcting code can be used that can reconstruct d data chunks from any set of d unique, healthy chunks (either data chunks or code chunks).

A codeword is a set of data chunks and code chunks based on those data chunks. If an MDS code is used to generate a codeword containing d data chunks and n code chunks, then all of the chunks (data or code) can be reconstructed as long as any d healthy chunks (data or code) are available from the codeword.

Forming a conventional orthogonal code includes combining two linear systematic maximum distance separable (MDS) codes. A block of data is viewed as forming a two-dimensional matrix of m×n chunks. One MDS code is used to generate error-correcting row code chunks for each row while the other MDS code is used to generate error-correcting column code chunks for each column, e.g., including any columns of row code chunks. Orthogonal codes can also be formed by viewing a block of data as a higher-dimensional matrix and using different error-correcting codes for each dimension.

When a chunk is identified as being damaged (e.g., using an error-detecting code), both the row code chunks and the column code chunks can be used to reconstruct the damaged chunk. In some cases, it may be possible to alternate using the row code chunks and the column code chunks for reconstruction until all of the damaged chunks are reconstructed, even if initially some row or column chunks cannot be reconstructed.

The structure of conventional orthogonal codes creates a certain dependency between some codewords having different data chunks. To illustrate the dependency, let A and B be any two chunks (data or code) that are in a same codeword, and let A' be a different chunk which is in another codeword with A but is not in a codeword with B. It follows from the structure of a conventional orthogonal code that another chunk B' exists, where A' and B' are in a same codeword and B and B' are also in a same codeword. Table 1 graphically illustrates this

TABLE 1

| A | A' |
|---|----|
| B | B' |

In Table 1, each row forms a codeword, and each column forms a codeword. Because A and B are in a same column, they are in a same codeword. Because A and A' are in a same row, they are in a same codeword. From the structure of the code, it follows that B' exists and is in a same codeword as A' and a same codeword as B.

A set of chunks A, B, A', and B' form a rectangular set if they are related as described above. The existence of rectangular sets of chunks increases the likelihood that there will be a set of damaged chunks that cannot be reconstructed. For example, if each row codeword has a single code chunk and each column codeword has a single code chunk, and if A, B, A', and B' form a rectangular set and they are all damaged, then it is impossible to reconstruct any of them without other information.

Using a different structure for how the codewords from different dimensions are combined can prevent or reduce the frequency of rectangular sets. In particular, codewords from different dimensions can be combined in a skewed manner, as described below, to improve the encoding system's 102 ability to reconstruct damaged chunks. Skewed orthogonal coding techniques are described generally here in reference to FIG. 1, and examples are given below in reference to the other figures.

In general, the encoding system 102 stores data (e.g., from a file received over a network) by partitioning the data into blocks. Each block can be viewed as forming a matrix of data chunks, and code chunks are added to the block in various ways to form codewords of data chunks and code chunks. The data chunks will have places within a matrix (e.g., a 2D matrix or a 3D matrix), but the data chunks typically do not occupy all of the places within the matrix because some places will hold code chunks.

In general, the data and code chunks are viewed as forming a set of k levels, with each chunk being in a single level. The resulting codewords include intra-level codewords, which include data and code chunks that are all in a single level, and inter-level codewords, which include data and code chunks in different levels. Each level can be allocated to a distinct data center (e.g., one of data centers 104, 106, and 108), or multiple levels can be allocated to a single data center. For example, all of the levels can be stored at a single data center.

Each chunk belongs to one of four classes of chunks. For purposes of illustration, each class will be identified by one of the following identifiers: D chunks, L chunks, R chunks, and LR chunks. D chunks are data chunks. L chunks are local code chunks, which are code chunks for codewords having D and possibly L chunks where all of the chunks within a codeword are in a single level (the codeword is an intra-level codeword.) R chunks are remote code chunks, which are code chunks for codewords possibly having D, L, and R chunks where all of the chunks in a given codeword are in different levels (the codeword is an inter-level codeword.) LR chunks are local-remote code chunks, which are code chunks for codewords having R and possibly LR chunks where all of the chunks in a given codeword are in a single level.

The L chunks are used for intra-level reconstruction of damaged D and L chunks, the R chunks are used for inter-level reconstruction of damaged D, L and R chunks, and the LR chunks are used for intra-level reconstruction of damaged R and LR chunks. Classifying the chunks into these four classes helps illustrate that a particular skewed orthogonal coding technique does not have any cyclic dependencies. For example, if a D chunk is modified, the modification affects one or more L chunks in the same level, which in turn could affect one or more R chunks in other levels, which in turn could affect one or more LR chunks in those other levels.

In some implementations, metadata is used at one or more of the encoding system 102 or the data centers 104, 106, and 108 to keep track of data. For example, the metadata can specify which parts of a file are stored at which data centers, where redundant copies of data are stored, and/or which data chunks and code chunks form codewords.

Figure 2:
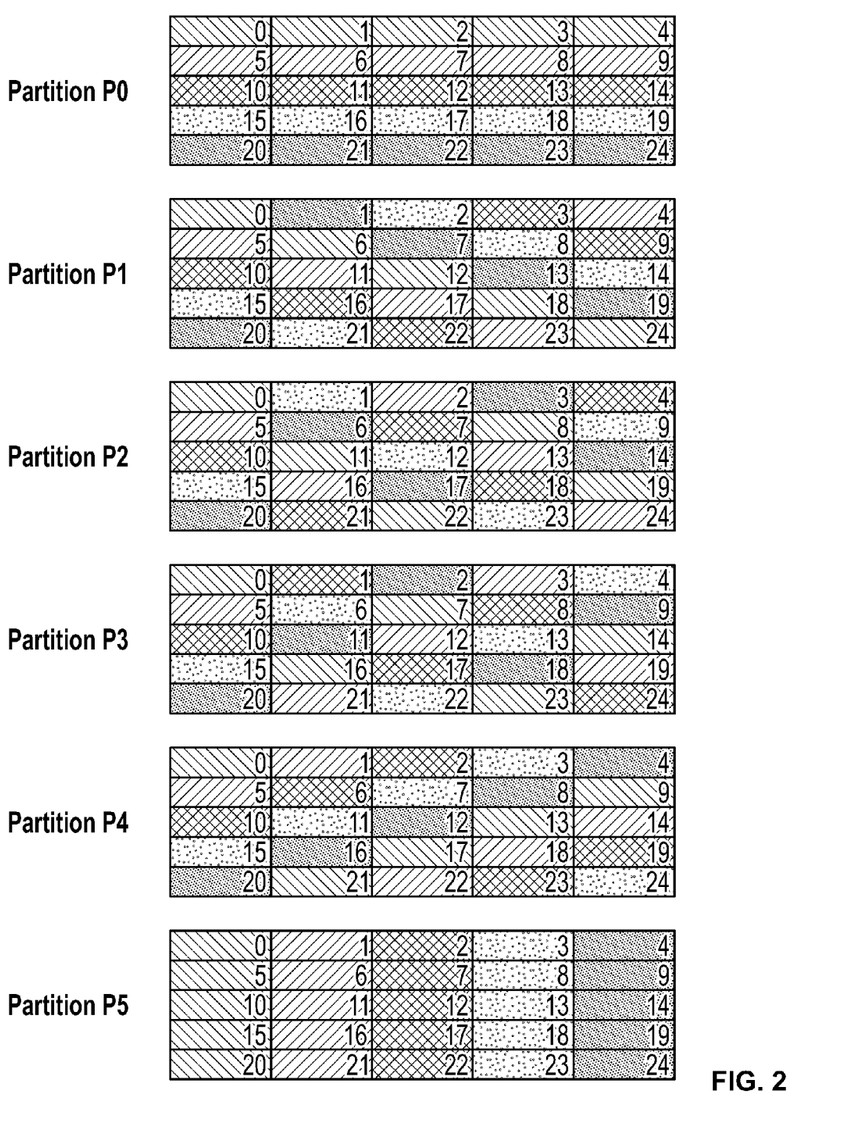
FIG. 2 is a diagram illustrating an example set of orthogonal partitions that can be used in forming a skewed orthogonal code.
Figure 3A:
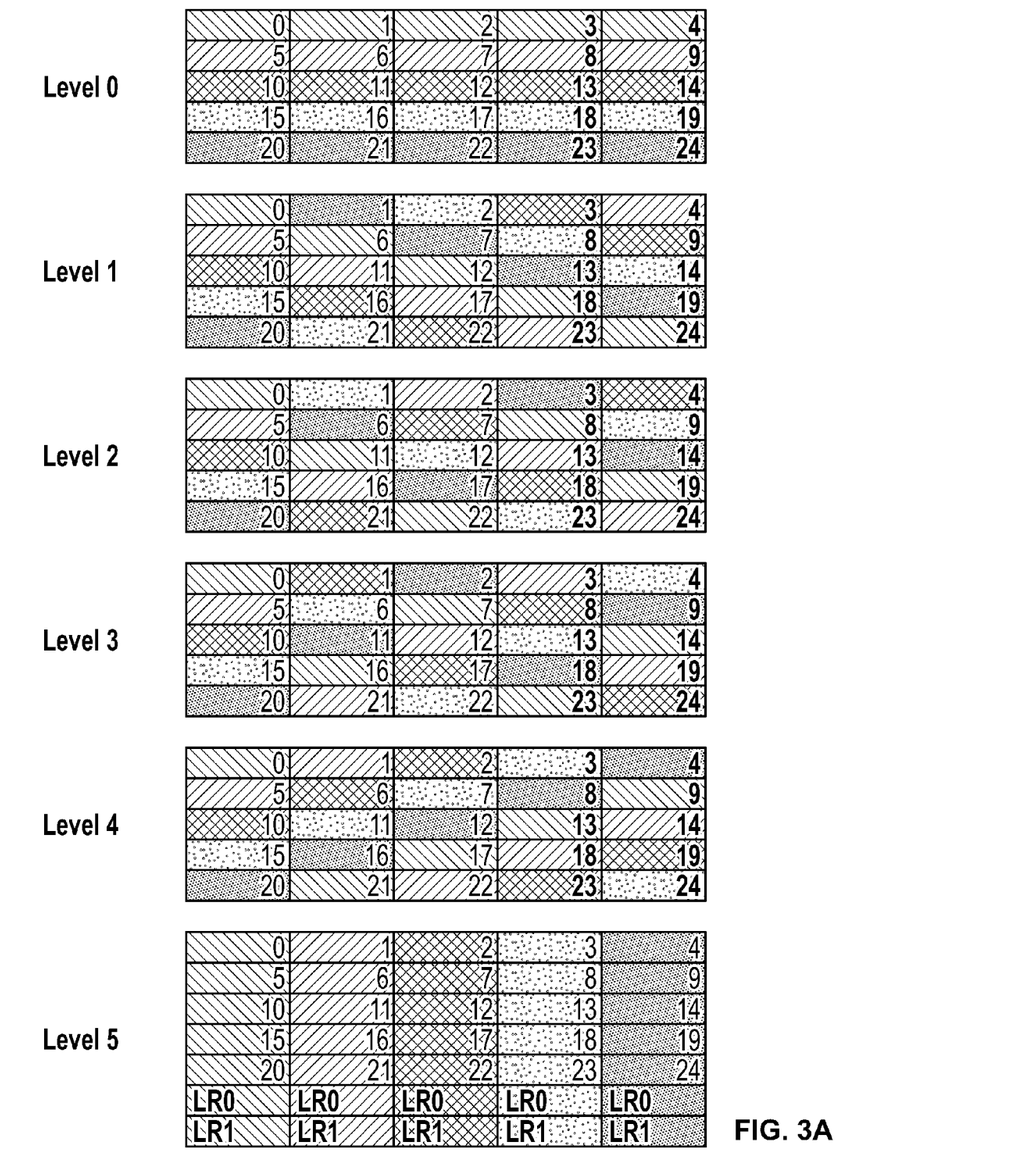
FIGS. 3A-C are diagrams illustrating skewed orthogonal coding techniques based on the orthogonal partitions of FIG. 2.
Figure 3B:
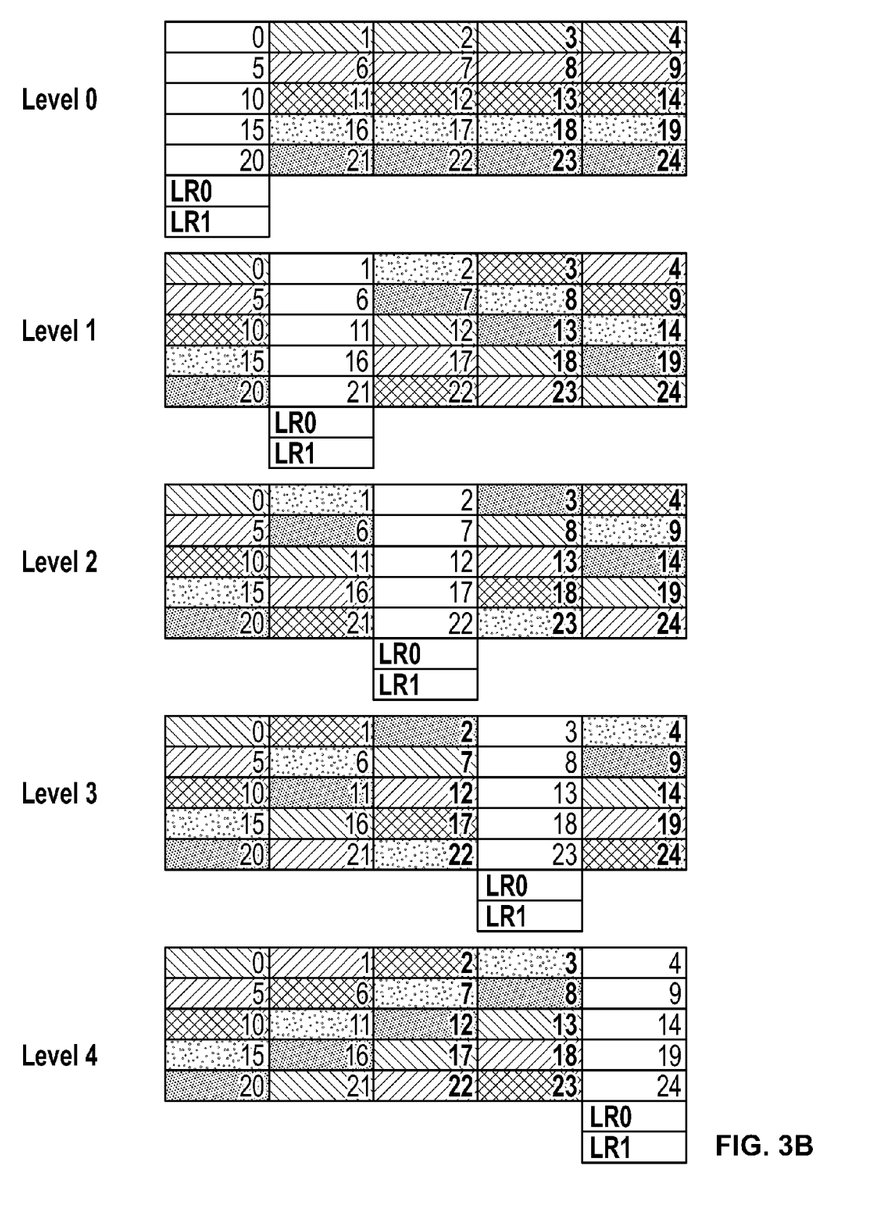
Figure 3C:
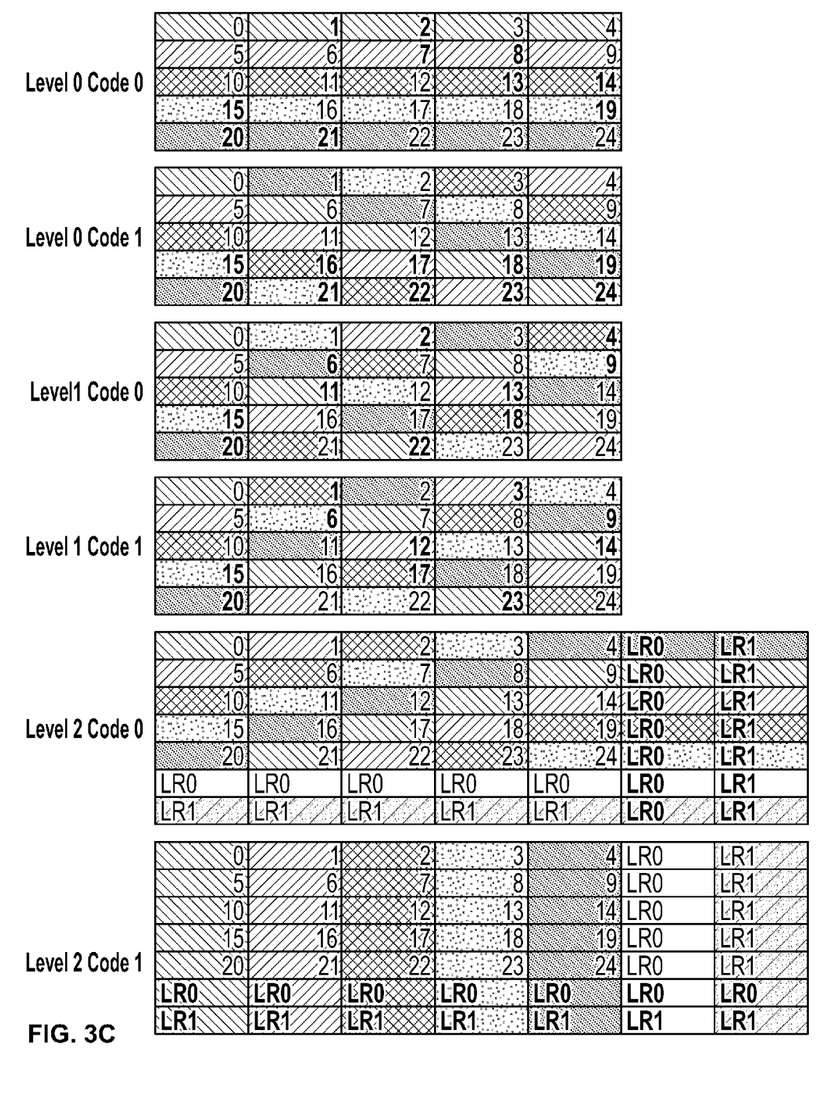

FIGS. 2 and 3A-C illustrate construction of skewed orthogonal coding techniques using orthogonal partitions. FIG. 2 is a diagram illustrating an example set of orthogonal partitions that can be used in forming a skewed orthogonal code. FIGS. 3A-C are diagrams illustrating skewed orthogonal coding techniques based on the orthogonal partitions of FIG. 2.

A partition defines groups of numbers. Given a set S of x numbers, 0 . . . x−1, a set of k partitions of these numbers, P0 . . . Pk−1, is said to be orthogonal when: given any two numbers x1 and x2 in S, if x1 and x2 are in the same group in some partition Pi, then x1 and x2 are not in the same group in any other partition Pj where j≠i. In other words, x1 and x2 are in a same group in a first partition and not in a same group in any other partition.

Consider the set of partitions illustrated in FIG. 2. There are six partitions, P0 . . . P5, each illustrated by a table of rows and columns. The numbers 0 . . . 24 are viewed as forming a 5×5 matrix. Each partition defines groups of the numbers 0 . . . 24. The defined groups are illustrated using different shadings. The numbers grouped by a partition are typically integers.

For example, each box in the first row of P0 has the same shading. The numbers 0 . . . 4 are in the first row, and since they each have the same shading, they are in a same group. Similarly, numbers 5 . . . 9 are in a same group, numbers 10 . . . 14 are in a same group, numbers 15 . . . 19 are in a same group, and numbers 20 . . . 21 are in a same group.

In partition P1, numbers 0, 6, 12, 18, and 24 have the same shading, so they are in a same group. Similarly, numbers 5, 11, 17, 23, 4 are in a same group, numbers 10, 16, 22, 3, and are in a same group; numbers 15, 21, 2, 8, and 14 are in a same group; and numbers 20, 1, 7, 13, and 19 are in a same group.

To illustrate that the partitions are orthogonal, consider a couple example pairs of numbers. First, consider 0 and 1. Those numbers are in a same group in P0, but not any other partition. Second, consider 0 and 2. Those numbers are also in the same group in P0, but not in any other partition. Further inspection of pairs of numbers shows that, for any pair in a same group of a partition, that pair is not in a same group in any other partition.

Orthogonal partitions can be created or selected using various techniques. For example, to create the set of orthogonal partitions P0 . . . P5 of FIG. 2, partition Pi, 0≤i≤4, can be formed by grouping numbers from successive columns while going down i rows (cyclically). Partition P5 is formed by grouping numbers by columns. In general, p+1 such orthogonal partitions can be created for any p×p matrix where p is a prime number. Other techniques for creating orthogonal partitions include using block designs, affine and projective geometries, and mutually orthogonal Latin squares.

FIG. 3A is a diagram conceptually illustrating an example skewed orthogonal coding technique. Six tables are shown, labeled Level 0 through Level 5. Each table represents a level. Different levels are allocated to different groups of storage nodes. Items with the same shading in a same level form an intra-level codeword. Items with the same number in different levels form an inter-level codeword. Code chunks for intra-level codewords are shown in bold. Construction of the technique will be described generally, and then the specific example shown in FIG. 3A will be described. The skewed orthogonal coding technique can be constructed, for example, by one or more individuals or a computer using the orthogonal partitions of FIG. 2. After the skewed orthogonal coding technique is constructed, the coding technique is used by a system of one or more computers for data storage as described below in reference to FIG. 5.

For each of k levels, locations of the level are numbered from 0 . . . x−1. The locations are the cells in the tables shown in FIG. 3A, and as shown there, each cell is numbered. Each location corresponds to a chunk (either a data chunk or a code chunk.) The locations are used to organize which data chunks will form codewords with other data chunks. The locations that are numbered are the locations in which the D, L, and R chunks will be stored.

The last m levels are selected to include R chunks, where m<k. Each inter-level codeword includes chunks at locations numbered with the same number in the range 0 . . . x−1 from each of the k levels. Thus, there are a total of x inter-level codewords. Each inter-level codeword includes (k−m) D and/or L chunks and a total of m R chunks. So any set of m or fewer damaged chunks of the codeword can be reconstructed if MDS codes are used to generate the code chunks. The exact numbers of D and L chunks per inter-level codeword can be adjusted to increase the reliability of the stored data or decrease storage requirements—codewords with more L chunks can be reconstructed after a greater number of chunks are damaged, but store less total data.

A set of k orthogonal partitions, P0 . . . Pk−1, of the numbers 0 . . . x−1 is selected. Partition i is used to organize the chunks in level i into intra-level codewords. In the first (k−m) levels, n of the chunks in each intra-level codeword are designated as L chunks and the remaining chunks in the codeword are designated as D chunks. Increasing n results in a greater reliability at the cost of greater storage requirements.

The last m levels, as noted above, store R chunks. The last m levels are also designated to store n additional LR chunks. Thus, each intra-level codeword includes n L or LR chunks.

Any set of n or fewer damaged chunks of the intra-level codeword can be reconstructed if MDS codes are used to generate the code chunks.

In the example technique illustrated in FIG. 2A, k=6, so a block of data will be stored across six different levels and thus six different groups of storage nodes. x=25, so 25 locations per level will store D, L and R chunks. m=1, so one of the levels, level 5, will store R chunks. n=2, so in the first five levels, two of the chunks in each intra-level codeword are code chunks and the remaining chunks are data chunks. Level 5 contains two additional LR chunks for each intra-level codeword in level 5.

The intra-level codewords are organized according to the groups of the numbered locations. Consider level 0. The locations are numbered from 0 . . . 24, and the numbers are grouped according to partition P0 from the set of orthogonal partitions shown in FIG. 2. So, since the locations for numbers 0, 1, 2, 3, and 4 are in a same group, the chunks at those locations form an intra-level codeword. The numbers 3 and 4 are shown in bold, so those locations store code chunks. Those code chunks are L chunks. The locations for the other numbers in the row (0, 1, and 2) store data chunks. The code chunks at the locations numbered 3 and 4 are generated using an error-correcting code and the data chunks at the locations numbered 0, 1, and 2.

Now consider level 1. The locations numbered 0, 6, 12, 18, and 24 are in a same group, so those locations form an intra-level codeword. The numbers 18 and 24 are shown in bold, so those locations store code chunks. Those code chunks are L chunks. The locations for the other numbers (0, 6, and 12) store data chunks. The code chunks at the locations numbered 18 and 24 are generated using an error-correcting code and the data chunks at the locations numbered 0, 6, and 12.

The inter-level codewords are organized according to the numbers themselves of the numbered locations. Consider the number 0, which has a location in each level. The chunks stored at each location numbered 0 across all of the levels form an inter-level codeword. Because m=1, there is one code chunk for that inter-level codeword, and it is stored in level 5 at the location numbered 0. That code chunk is an R chunk. That R chunk is generated using an error-correcting code and the data chunks at the locations numbered 0 at levels 0 . . . 4.

Now consider the number 4, which has a location in each level. Because the number 4 is shown in bold, the chunks stored at those locations are code chunks. They are L chunks for the intra-level codewords according to the groupings at each level. The chunks stored at each location numbered 4 across all of the levels form an inter-level codeword. Again, because m=1, there is one code chunk for that inter-level codeword and it is stored in level 5 at the location numbered 4. That code chunk is an R chunk. That R chunk is generated using an error-correcting code and the L chunks at the locations numbered 4 at levels 0.4, where the L chunks are in turn generated using an error-correcting code and D chunks at each level as described above.

LR chunks are allocated to level 5. As discussed above, the LR chunks are code chunks for codewords including R and LR chunks for a single level. In this case, the LR chunks provide for reconstruction of the R and LR chunks in level 5. The LR chunks are generated using an error-correcting code and the other chunks according to the groupings of partition P5 from FIG. 2.

Consider the group of locations numbered 0, 5, 10, 15, and 20 in level 5. Those numbers are grouped together and thus form a codeword. However, each of those locations is already allocated to store an R code chunk based on chunks in the other levels, so to provide error correction of those chunks, the LR chunks are added. Because n=2, two LR chunks are added. For this group, the two locations labeled LR0 and LR1 having the same shading as the other locations in the group are the two LR chunks for the group. Those LR chunks are generated using an error-correcting code and the R chunks at locations numbered 0, 5, 10, 15, and 20, where the R chunks are in turn based on the D chunks at the other levels as described above.

Now consider the group of locations numbered 4, 9, 14, 19, and 24 in level 5. Those numbers are grouped together and thus form a codeword. For this group, the two locations labeled LR0 and LR1 having the same shading as the other locations in the group are the two LR chunks for the group. Those LR chunks are generated using an error-correcting code and the R chunks at locations numbered 4, 9, 14, 19, and 24, where the R chunks are in turn based on the L chunks at the other levels as described above.

FIG. 3B is a diagram that conceptually illustrates another example skewed orthogonal coding technique.

In this example, the R chunks are distributed (e.g., evenly) among the different levels. The R chunks are illustrated as having no shading (a blank background in each cell.) In this technique, the last partition (P5 from FIG. 2) is used to determine which level contains the R chunk for each inter-level codeword. More specifically, the groups in P5 are numbered 0.4 (corresponding to the different shadings) and for any number a, $0 \leq a \leq x-1$, if a is in a group then the R chunk for the inter-level codeword including locations numbered a is located in level i. LR chunks for those R chunks can also be located in level i. Although the example shown is for the case where each inter-level codeword includes a single R chunk, the technique can be similarly extended for inter-level codewords including more R chunks.

For example, consider a=0. The first group in P5, which would be numbered 0, includes the numbers 0, 5, 10, 15, and 20. a is in group 0 because 0 is in group 0, so level 0 includes the R chunk for the inter-level codeword formed of data chunks at positions numbered 0 across the different levels. Similarly, level 0 includes the R chunks for positions numbered 5, 10, 15, and 20. Because those R chunks are stored in level 0, the LR chunks for those R chunks are also stored in level 0.

FIG. 3C is a diagram that conceptually illustrates another example skewed orthogonal coding technique.

In this example, a pair of orthogonal partitions is assigned to each level and each chunk is included in two intra-level codewords (defined by the two partitions assigned to that level). In this manner, each level forms a conventional orthogonal code, while the inter-level codewords are skewed relative to all of the intra-level codewords (that is, there are no rectangular sets involving inter-level codewords). In this example, additional LR chunks are added in the level(s) containing R chunks and the R plus LR chunks in a level form an orthogonal code (which is larger than the orthogonal codes in the levels containing D and L chunks).

For example, consider level 0. Two orthogonal partitions (P0 and P1) from FIG. 2 are assigned to level 0. Intra-level codewords within level 0 are formed according to those partitions. R chunks for those codewords are allocated to level 2, organized according to partitions P4 and P5 of FIG. 2.

Figure 4:
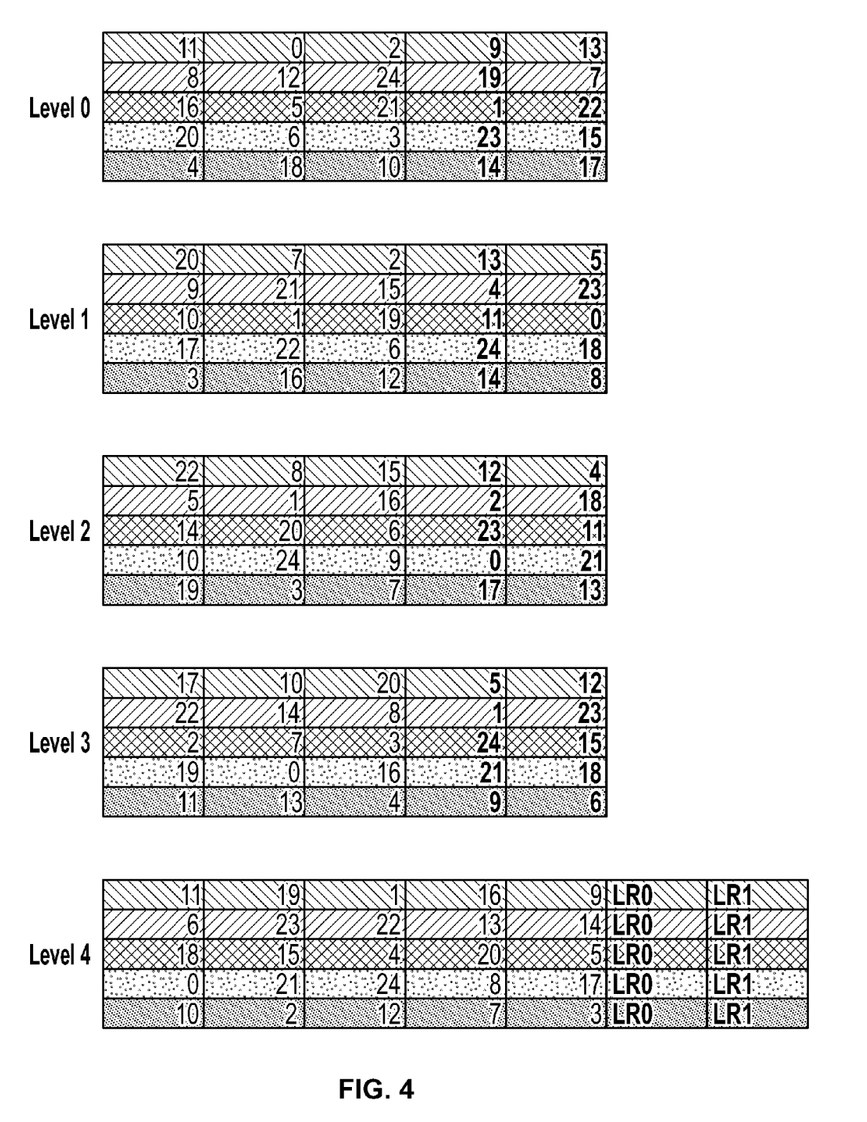
FIG. 4 is a diagram conceptually illustrating another example skewed orthogonal coding technique based on random partitions.

FIG. 4 is a diagram conceptually illustrating another example skewed orthogonal coding technique based on random partitions.

While orthogonal partitions can be used to prevent rectangular sets, another approach to creating skewed orthogonal codes having few or no rectangular sets is to use randomization in assigning chunks to inter-level codewords. Either an arbitrary random assignment can be used, or multiple random assignments can be tried until one is found that has no, or very few, rectangular sets. Specifically, the code can be constructed as follows.

To define different levels, x locations per level are assigned the numbers 0 ... x−1 randomly or pseudo-randomly. These are the locations in which the D, L and R chunks will be stored. The last m<k levels are selected to contain R chunks. Each inter-level codeword includes chunks with the same number in the range 0 ... x−1 from each of the k levels. Thus, there are a total of x inter-level codewords. Each inter-level codeword includes (k−m) D and/or L chunks and a total of m R chunks, and can therefore be used to correct any set of m or fewer damaged chunks.

For each level, a partition of the x locations containing the D, L and R chunks is selected. The partitions are used to divide the chunks in each level into intra-level codewords, e.g., as described above for the orthogonal partitions. In the first k−m levels, n of the chunks in each intra-level codeword are designated as L chunks and the remaining chunks in the codeword are designated as D chunks. In the last m levels, all of the chunks are designated as R chunks. Furthermore, for each codeword in the last m levels, n additional LR chunks are added. So each intra-level codeword contains n L or LR chunks and can therefore correct any set of n or fewer damaged chunks.

Figure 5:
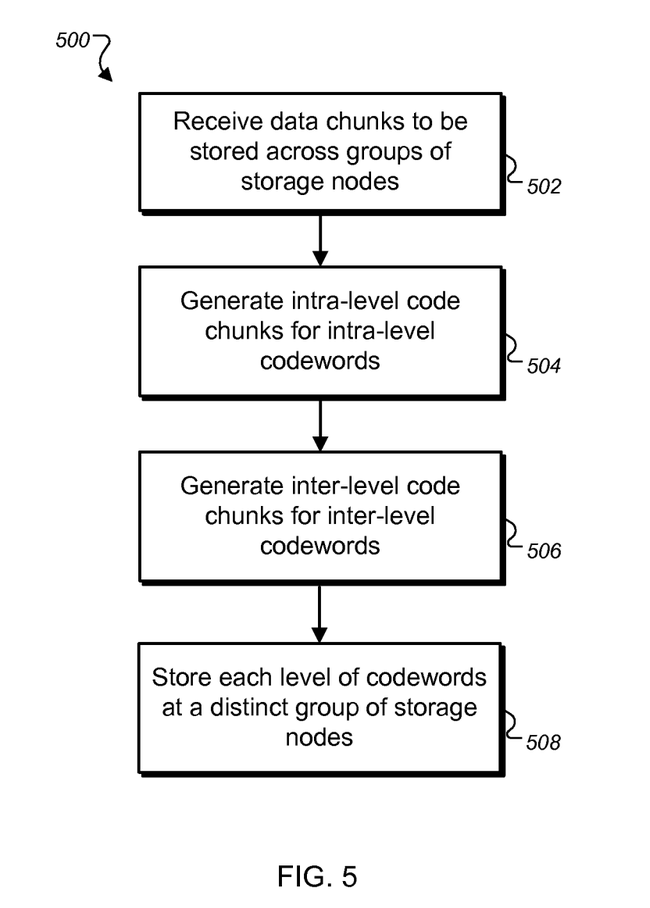
FIG. 5 is a flow diagram of an example process for storing data using a skewed orthogonal code.

FIG. 5 is a flow diagram of an example process 500 for storing data using a skewed orthogonal code. The process 500 can be performed by, for example, a system of one or more data processing apparatus (e.g., the encoding system 102 of FIG. 1). For purposes of illustration, the process 500 will be described with respect to a system that performs the process 500.

The system receives data chunks to be stored across k groups of storage nodes using k partitions of x numbers (502). The data chunks can be, for example, contiguous or non-contiguous blocks of data from a file. The file can be, for example, an email message, a web page, an image file, or other type of file. The system uses the partitions to organize the data chunks across the storage nodes, and to generate code chunks to create intra-level codewords and inter-level codewords.

The system generates intra-level code chunks using the data chunks and a first error-correcting code (504). The intra-level code chunks are generated using the groups of the partitions, so the data chunks and the intra-level code chunks form intra-level codewords organized according to the groups of partitions (e.g., so that chunks assigned to a group form an intra-level codeword.) Examples of generating intra-level code chunks using the groups of the partitions are described above in reference to FIGS. 2-4.

The system generates inter-level code chunks using the data chunks and a second error-correcting code (506). The inter-level code chunks are generated using the numbers of the partitions, so the data chunks and the inter-level code chunks form inter-level codewords organized according to the numbers of partitions (e.g., so that chunks assigned to a same number form an inter-level codeword.) Examples of generating inter-level code chunks using the numbers of the partitions are described above in reference to FIGS. 2-4.

The system stores each level of k levels of codewords at a distinct group of storage nodes (508). For example, the system can allocate the codewords across the levels as described above in reference to FIGS. 3A-C and FIG. 4.

The partitions are selected so that, for at least a first set of chunks A, B, and A' wherein A and B are in a same intra-level codeword and A and A' are in a same inter-level codeword, there is no chunk B' that is in both an intra-level codeword containing A' and an inter-level codeword containing B. This results in a skewed orthogonal code, as described above.

For example, the k partitions of x numbers can be orthogonal so that, for any two numbers x1 and x2, x1 and x2 are in a same group in a first partition and not in a same group in any other partition, as described above with reference to FIG. 2. The k partitions of x numbers can define the groups of numbers based on random numbers, as described above with reference to FIG. 4.

As described above with reference to FIG. 3A, m of the levels can include the inter-level code chunks, wherein m is greater than or equal to one; and (k−m) of the levels can include the intra-level codewords, each intra level codeword including d data chunks and n code chunks. Storing each level of the k levels of codewords can include distributing the inter-level code chunks evenly across the k groups of storage nodes, as described above with reference to FIG. 3B. Distributing the inter-level code chunks evenly across the k groups of storage nodes can include allocating the inter-level code chunks to groups of storage nodes according to the numbers of one of the partitions, e.g., as described above with respect to FIG. 3B. Two orthogonal partitions can be assigned to each level and each data chunk can be included in two intra-level codewords organized according to the two partitions assigned to that level, as described above with reference to FIG. 3C.

In some implementations, the system generates and stores local-remote code chunks for local-remote codewords that include the inter-level code chunks. The local-remote code chunks can be allocate to groups of storage nodes, for example, as described above with reference to FIGS. 3A-C and FIG. 4.

Figure 6:
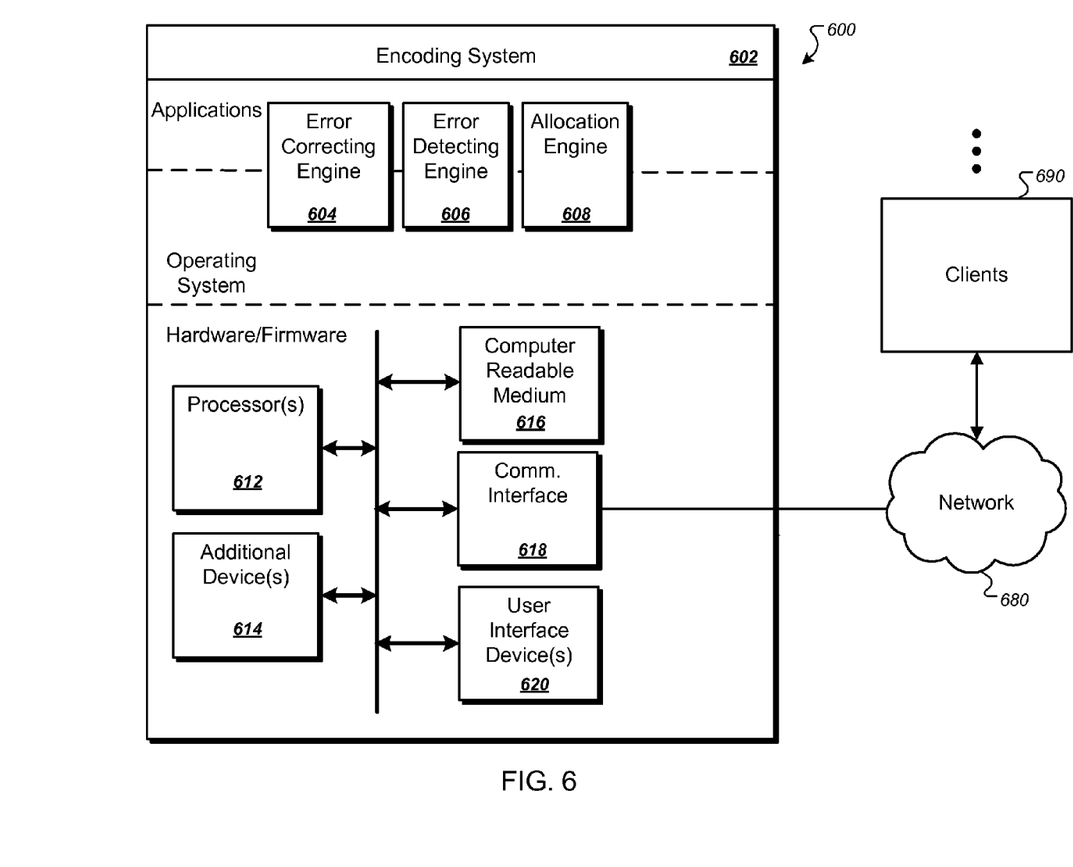
FIG. 6 is a schematic diagram of an example system.

FIG. 6 is a schematic diagram of an example system configured for data storage, access, and maintenance. The system generally consists of an encoding system 602 of one or more computers. The system 602 is optionally connected to one or more user or client computers 690 through a network 680. The system 602 includes various modules, e.g. executable software programs, including an error correcting engine 604 for generating code chunks and reconstructing damaged chunks. An error detecting code engine 606 is configured to identify damaged chunks of data. An allocation engine 608 allocates code chunks and data chunks between one or more groups of storage nodes.

Each module runs as part of the operating system on the system 602, runs as an application on the system 602, or runs as part of the operating system and part of an application on the system 602, for instance. Although several software modules are illustrated, there may be fewer or more software modules. Moreover, the software modules can be distributed on one or more data processing apparatus connected by one or more networks or other suitable communication mediums.

The system 602 also includes hardware or firmware devices including one or more processors 612, one or more additional devices 614, a computer readable medium 616, a communication interface 618, and optionally one or more user interface devices 620. Each processor 612 is capable of processing instructions for execution within the system 602. In some implementations, the processor 612 is a single or multi-threaded processor. Each processor 612 is capable of processing instructions stored on the computer readable medium 616 or on a storage device such as one of the additional devices 614. The system 602 uses its communication interface 618 to communicate with one or more computers 690, for example, over a network 680.

In some implementations, the system 602 does not have any user interface devices. In other implementations, the system 602 includes one or more user interface devices. Examples of user interface devices 620 include a display, a camera, a speaker, a microphone, a tactile feedback device, a keyboard, and a mouse. The system 602 can store instructions that implement operations associated with the modules described above, for example, on the computer readable medium 616 or one or more additional devices 614, for example, one or more of a floppy disk device, a hard disk device, an optical disk device, or a tape device.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method performed by one or more computers, the method comprising:
receiving a plurality of data chunks to be stored using k partitions of x numbers, wherein k and x are each greater than one, and wherein each partition defines a plurality of groups of the x numbers;
generating a plurality of intra-level code chunks using the data chunks and a first error-correcting code, resulting in a plurality of intra-level codewords organized according to the groups of the partitions;
generating a plurality of inter-level code chunks using the data chunks and a second error-correcting code, resulting in x inter-level codewords organized according to the numbers of the partitions; and
storing each level of k levels of codewords, the k levels of codewords including the plurality of intra-level codewords and the plurality of inter-level codewords;
wherein the partitions are selected so that, for at least a first set of chunks A, B, and A' wherein A and B are in a same intra-level codeword and A and A' are in a same inter-level codeword, there is no chunk B' that is in both an intra-level codeword containing A' and an inter-level codeword containing B.

2. The method of claim 1, wherein storing each level of k levels of codewords includes storing each level at a distinct group of storage nodes.

3. The method of claim 1, wherein generating the intra-level code chunks includes associating each data chunk with a group of the partitions, and wherein each intra-level codeword includes data chunks associated with a same group.

4. The method of claim 1, wherein generating the inter-level code chunks includes associating each data chunk with a number of the partitions, and wherein each inter-level codeword includes data chunks associated with a same number.

5. The method of claim 1, wherein the k partitions of x numbers are orthogonal so that, for any two numbers x1 and x2, x1 and x2 are in a same group in a first partition and not in a same group in any other partition.

6. The method of claim 1, wherein the k partitions of x numbers define the groups of numbers based on random or pseudo-random numbers.

7. The method of claim 1, wherein:
m of the levels include the inter-level code chunks, wherein m is greater than or equal to one; and
(k−m) of the levels include the intra-level codewords, each intra-level codeword including d data chunks and n code chunks.

8. The method of claim 1, wherein storing each level of the k levels of codewords includes distributing the inter-level code chunks evenly across the k groups of storage nodes.

9. The method of claim 8, wherein distributing the inter-level code chunks evenly across the k groups of storage nodes includes allocating the inter-level code chunks to groups of storage nodes according to the numbers of one of the partitions.

10. The method of claim 1, wherein two orthogonal partitions are assigned to each level and each data chunk is included in two intra-level codewords organized according to the two partitions assigned to that level.

11. The method of claim 1, further comprising generating and storing local-remote code chunks for local-remote codewords that include the inter-level code chunks.

12. The method of claim 1, wherein the first and second error-correcting codes are linear Maximal Distance Separable (MDS) codes in systematic form.

13. A system of one or more computers configured to perform operations comprising:
receiving a plurality of data chunks to be stored using k partitions of x numbers, wherein k and x are each greater than one, and wherein each partition defines a plurality of groups of the x numbers;
generating a plurality of intra-level code chunks using the data chunks and a first error-correcting code, resulting in a plurality of intra-level codewords organized according to the groups of the partitions;
generating a plurality of inter-level code chunks using the data chunks and a second error-correcting code, resulting in x inter-level codewords organized according to the numbers of the partitions; and storing each level of k levels of codewords, the k levels of codewords including the plurality of intra-level codewords and the plurality of inter-level codewords;

wherein the partitions are selected so that, for at least a first set of chunks A, B, and A' wherein A and B are in a same intra-level codeword and A and A' are in a same inter-level codeword, there is no chunk B' that is in both an intra-level codeword containing A' and an inter-level codeword containing B.

14. The system of claim 13, wherein storing each level of k levels of codewords includes storing each level at a distinct group of storage nodes.

15. The system of claim 13, wherein generating the intra-level code chunks includes associating each data chunk with a group of the partitions, and wherein each intra-level codeword includes data chunks associated with a same group.

16. The system of claim 13, wherein generating the inter-level code chunks includes associating each data chunk with a number of the partitions, and wherein each inter-level codeword includes data chunks associated with a same number.

17. The system of claim 13, wherein the k partitions of x numbers are orthogonal so that, for any two numbers x1 and x2, x1 and x2 are in a same group in a first partition and not in a same group in any other partition.

18. The system of claim 13, wherein the k partitions of x numbers define the groups of numbers based on random or pseudo-random numbers.

19. The system of claim 13, wherein:
m of the levels include the inter-level code chunks, wherein m is greater than or equal to one; and
(k−m) of the levels include the intra-level codewords, each intra-level codeword including d data chunks and n code chunks.

20. The system of claim 13, wherein storing each level of the k levels of codewords includes distributing the inter-level code chunks evenly across the k groups of storage nodes.

21. The system of claim 20, wherein distributing the inter-level code chunks evenly across the k groups of storage nodes includes allocating the inter-level code chunks to groups of storage nodes according to the numbers of one of the partitions.

22. The system of claim 13, wherein two orthogonal partitions are assigned to each level and each data chunk is included in two intra-level codewords organized according to the two partitions assigned to that level.

23. The system of claim 13, the operations further comprising generating and storing local-remote code chunks for local-remote codewords that include the inter-level code chunks.

24. The system of claim 13, wherein the first and second error-correcting codes are linear Maximal Distance Separable (MDS) codes in systematic form.

25. A non-transitory tangible computer storage medium encoded with a computer program, the program comprising instructions that when executed by one or more computers cause the one or more computers to perform operations comprising:

receiving a plurality of data chunks to be stored using k partitions of x numbers, wherein k and x are each greater than one, and wherein each partition defines a plurality of groups of the x numbers;

generating a plurality of intra-level code chunks using the data chunks and a first error-correcting code, resulting in a plurality of intra-level codewords organized according to the groups of the partitions;

generating a plurality of inter-level code chunks using the data chunks and a second error-correcting code, resulting in x inter-level codewords organized according to the numbers of the partitions; and storing each level of k levels of codewords, the k levels of codewords including the plurality of intra-level codewords and the plurality of inter-level codewords;

wherein the partitions are selected so that, for at least a first set of chunks A, B, and A' wherein A and B are in a same intra-level codeword and A and A' are in a same inter-level codeword, there is no chunk B' that is in both an intra-level codeword containing A' and an inter-level codeword containing B.

26. The computer storage medium of claim 25, wherein storing each level of k levels of codewords includes storing each level at a distinct group of storage nodes.

27. The computer storage medium of claim 25, wherein generating the intra-level code chunks includes associating each data chunk with a group of the partitions, and wherein each intra-level codeword includes data chunks associated with a same group.

28. The computer storage medium of claim 25, wherein generating the inter-level code chunks includes associating each data chunk with a number of the partitions, and wherein each inter-level codeword includes data chunks associated with a same number.

29. The computer storage medium of claim 25, wherein the k partitions of x numbers are orthogonal so that, for any two numbers x1 and x2, x1 and x2 are in a same group in a first partition and not in a same group in any other partition.

30. The computer storage medium of claim 25, wherein the k partitions of x numbers define the groups of numbers based on random or pseudo-random numbers.

31. The computer storage medium of claim 25, wherein:
m of the levels include the inter-level code chunks, wherein m is greater than or equal to one; and
(k−m) of the levels include the intra-level codewords, each intra-level codeword including d data chunks and n code chunks.

32. The computer storage medium of claim 25, wherein storing each level of the k levels of codewords includes distributing the inter-level code chunks evenly across the k groups of storage nodes.

33. The computer storage medium of claim 32, wherein distributing the inter-level code chunks evenly across the k groups of storage nodes includes allocating the inter-level code chunks to groups of storage nodes according to the numbers of one of the partitions.

34. The computer storage medium of claim 25, wherein two orthogonal partitions are assigned to each level and each data chunk is included in two intra-level codewords organized according to the two partitions assigned to that level.

35. The computer storage medium of claim 25, the operations further comprising generating and storing local-remote code chunks for local-remote codewords that include the inter-level code chunks.

36. The computer storage medium of claim 25, wherein the first and second error-correcting codes are linear Maximal Distance Separable (MDS) codes in systematic form.

* * * * *